(12) United States Patent
Dunton et al.

(10) Patent No.: US 9,369,126 B1
(45) Date of Patent: Jun. 14, 2016

(54) SOLAR PHOTOVOLTAIC MODULE SAFETY SHUTDOWN SYSTEM

(71) Applicant: Helios Focus LLC, Scottsdale, AZ (US)

(72) Inventors: Randy R. Dunton, Phoenix, AZ (US); Geoffrey Sutton, Scottsdale, AZ (US)

(73) Assignee: Helios Focus LLC, Scottsdale, AZ (US)

( * ) Notice: Subject to any disclaimer, the term of this patent is extended or adjusted under 35 U.S.C. 154(b) by 70 days.

(21) Appl. No.: 14/511,042

(22) Filed: Oct. 9, 2014

Related U.S. Application Data (62) Division of application No. 12/813,036, filed on Jun. 10, 2010, now Pat. No. 8,859,884.

(60) Provisional application No. 61/252,985, filed on Oct. 19, 2009.

(51) Int. Cl.
| | |
|---|---|
| *H01L 31/042* | (2014.01) |
| *H03K 17/795* | (2006.01) |
| *H03K 17/687* | (2006.01) |
| *H01L 31/02* | (2006.01) |

(52) U.S. Cl.
CPC ...... *H03K 17/7955* (2013.01); *H01L 31/02021* (2013.01); *H03K 17/687* (2013.01)

(58) Field of Classification Search
CPC .......... H01L 31/0201; H03K 17/7955; H03K 17/687
USPC ........................................ 136/244
See application file for complete search history.

(56) References Cited

U.S. PATENT DOCUMENTS

| | | |
|---|---|---|
| 5,693,952 A | 12/1997 | Cox |
| 7,161,082 B2 | 1/2007 | Matsushita et al. |
| 7,807,919 B2 | 10/2010 | Powell et al. |
| 8,204,709 B2 | 6/2012 | Presher, Jr. et al. |
| 2002/0014262 A1 | 2/2002 | Matsushita et al. |
| 2006/0162772 A1 | 7/2006 | Presher, Jr. et al. |
| 2006/0231132 A1 | 10/2006 | Neussner |
| 2006/0267515 A1 | 11/2006 | Burke et al. |
| 2007/0186969 A1 | 8/2007 | Kohler et al. |
| 2008/0097655 A1 | 4/2008 | Hadar |
| 2008/0257397 A1 | 10/2008 | Glaser et al. |
| 2009/0020151 A1 | 1/2009 | Fornage |
| 2009/0141522 A1 | 6/2009 | Adest et al. |
| 2009/0182532 A1 | 7/2009 | Stoeber et al. |

(Continued)

FOREIGN PATENT DOCUMENTS

| | | |
|---|---|---|
| EP | 1039361 | 9/2000 |
| WO | WO2009051870 | 4/2009 |

(Continued)

OTHER PUBLICATIONS

Li et al., A Current Fed Two-Inductor Boost Converter for Grid Interactive Photovoltaic Applications, Austalasian Universities Power Engineering Conference, Brisbane Australia, pp. 1-6 (2004).

(Continued)

*Primary Examiner* — Jayne Mershon
(74) *Attorney, Agent, or Firm* — Adam R. Stephenson, Ltd.

(57) ABSTRACT

A PV system may be used in case of emergencies. Each individual photovoltaic module receives a signal to determine if it is allowed to be operational or must shut down. Modules by default are shut off and safe to handle, absent the signal and in the presence of light.

20 Claims, 11 Drawing Sheets

(56) References Cited

U.S. PATENT DOCUMENTS

| | | |
|---|---|---|
| 2010/0043868 A1 | 2/2010 | Sun et al. |
| 2010/0071742 A1 | 3/2010 | de Rooij et al. |
| 2010/0071744 A1 | 3/2010 | Peurach et al. |
| 2010/0071747 A1 | 3/2010 | Brescia et al. |
| 2010/0154858 A1 | 6/2010 | Jain |
| 2010/0269889 A1 | 10/2010 | Reinhold et al. |
| 2012/0139343 A1 | 6/2012 | Adest et al. |

FOREIGN PATENT DOCUMENTS

| | | |
|---|---|---|
| WO | WO2010065043 | 6/2010 |
| WO | WO2010078303 | 7/2010 |

OTHER PUBLICATIONS

Endecon Engineering, A Guide to Photovoltaic (PV) System Design and Installation, Consultant Report to California Energy Commission, pp. 1-39 (2001).

TUV, solar panel micro inverter 260W/grid tie micro inverter, catalogue page, (http://sunconpv.en.alibaba.com/product/663777786-213426577/solar_panel_micro_inverter_260W_grid_tie_micro_inverter.html), download Sep. 20, 2013.

Build it Solar, (http://builditsolar.com/Projects/Vehicles/E15ElecTrak/PVCharge.htm), download Sep. 20, 2013.

Enphase Microinverter M190, Microinverter Technical Data, pp. 1-2, Enphase Energy, Inc., Petaluma, California, available as early as Jun. 9, 2010.

Enphase Microinverter Models M190 and M210 Installation and Operations Manual, 2010, Rev. 8, pp. 1-28, Enphase Enerby, Inc., Petaluma, California.

Quick Install Guide, Enphase Energy, Inc., Petaluma, California, available as early as Jun. 9, 2010.

Field Wiring Diagram, Enphase Energy, Inc., Petaluma, California, available as early as Jun. 9, 2010.

PCT Search Report, dated Jun. 21, 2011, Application No. PCT/US2010/053164.

International Preliminary Report, dated Apr. 24, 2012, Application No. PCT/US2010/053164.

Written Opinion of International Search Authority, dated Apr. 19, 2012.

SOLAR PHOTOVOLTAIC MODULE SAFETY SHUTDOWN SYSTEM

CROSS REFERENCE TO RELATED APPLICATIONS

This application is a divisional application of the earlier U.S. Utility patent application Ser. No. 12/813,036, filed Jun. 10, 2010, titled "Solar Photovoltaic Module Safety Shutdown System," naming as first inventor Randy Richard Dunton, now pending, which claims the benefit of the filing date of U.S. Provisional Patent Application Ser. No. 61/252,985, filed Oct. 19, 2009, titled "Solar photovoltaic module safety shutdown system," naming as first inventor Randy Richard Dunton, the disclosures of each of which are hereby incorporated entirely herein by reference.

BACKGROUND

1. Technical Field

Aspects of this document relate generally to photovoltaic systems.

2. Background Art

Figure 1:
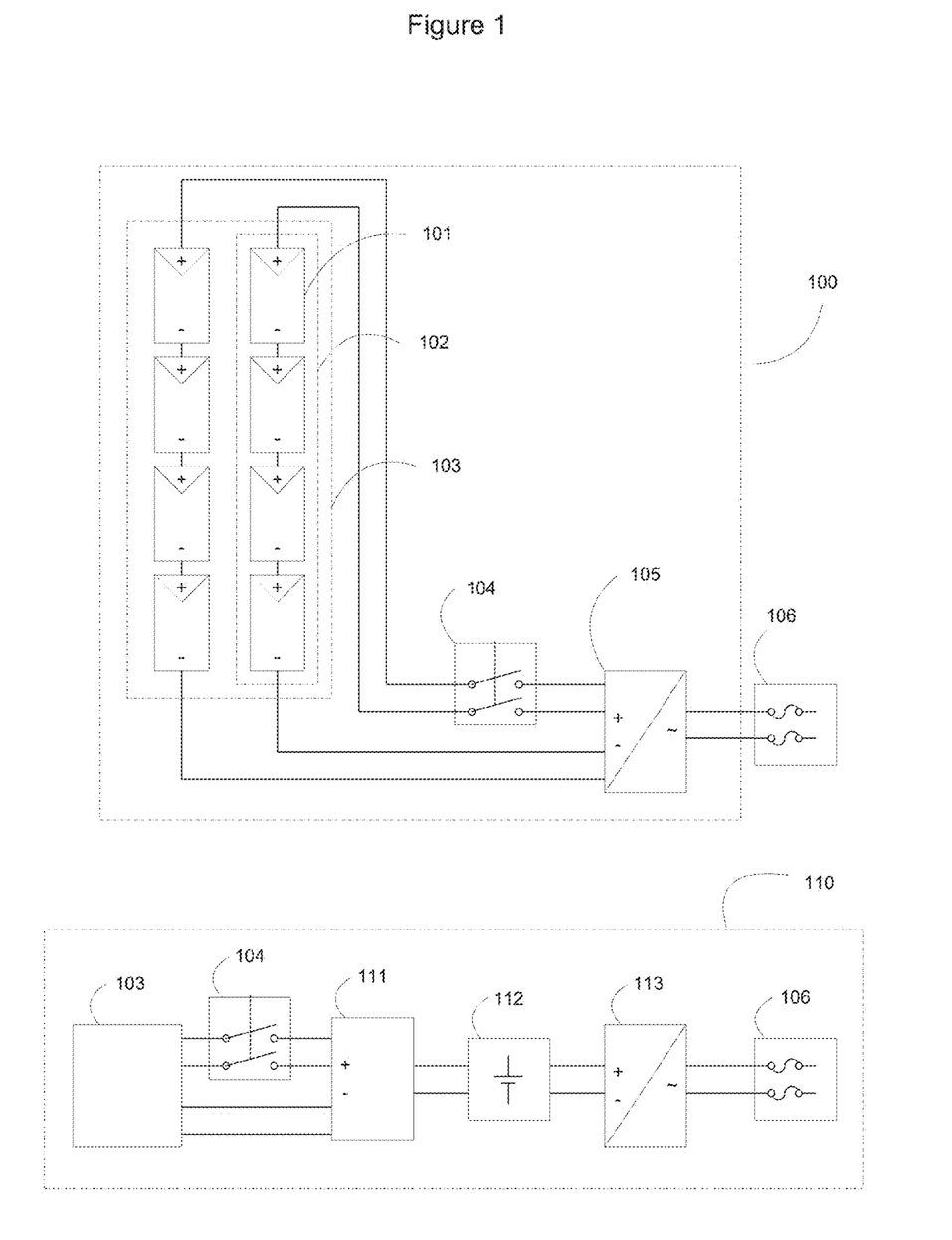
FIG. 1 illustrates two embodiments of a solar photovoltaic (PV) system with all the major system components.

FIG. 1 describes a typical photovoltaic (PV) grid-tied 100 or off-grid 110 system. A PV system consists of a number of modules 101; each module by itself generates power when exposed to light. A series of modules is wired together to create a higher voltage string 102. Multiple PV strings may be wired in parallel to form a PV array 103. The PV array connects to a DC-disconnect switch 104, and the DC disconnect switch feeds power to a grid-tied inverter 105 which converts the DC power from the array to AC power for the grid.

Off-grid systems 110 connect the PV array 103 to the DC disconnect, and on to a battery charger 111, which stores the electrical energy in batteries 112. Off-grid residential systems typically use an off-grid inverter 113 that produces AC electricity for AC loads connected to an AC main panelboard 106.

Figure 2:
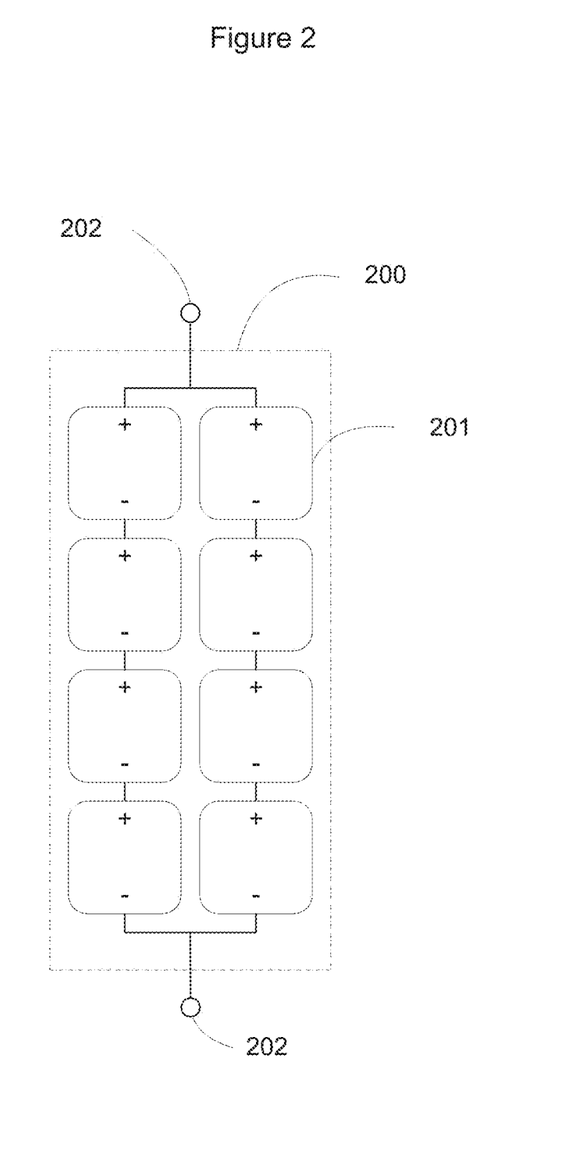
FIG. 2 illustrates the elements of a current PV module.

Inside a silicon cell based module 200, shown in FIG. 2, there is a series of photovoltaic cells 201, the basic building block in solar electric systems. Each cell is producing approximately 0.5 volts and a few amps (e.g. 5 A). The PV cells are also wired in series and in parallel within the module to achieve a desired voltage and current, and each module has a positive and negative module terminal 202 to connect to the PV system. A typical module used in a residential or commercial power generating system will produce in the order of 18-50V DC at 90-200 W at its electrical connectors. There are two terminals one positive and the other negative. Arrays used in residential installations will typically produce power in the range of 2 kW-10 kW with voltages up to 600V DC (grid-tied). The module voltage and power output is true for other module architectures such as thin-film (CdTe, CIGS, etc.)

When a PV array is installed and operational, the PV system generates power whenever there is light present. Furthermore, it is impractical to disable the system beyond shutting off the AC mains or the DC disconnect. Once wired, the array itself is never able to fully shut down in the presence of light even with the DC disconnect in the open position. The string wiring connecting all the modules in series, the wiring to the DC disconnect, and the array will all continue to generate lethal levels of voltage when exposed to light.

In the case of a damaged array from fire or natural disaster, an open (non-insulated) wire of the array's circuits may present itself. The exposed circuits provide a higher likelihood of an unintended electrical circuit path to ground (ground fault), and a human can become a part of this path to ground either by touching or through exposure to water. With a human body in a ground fault circuit it is very likely to be lethal. The National Fire Protection Association (NFPA) 70E defines "low voltage" somewhere near ~50V. This low voltage is the threshold where one is able to generally survive a shock and "let go" (~9 mA). PV systems are well above this level. This poses a serious and very real problem for firefighters when they encounter a building on fire with a PV array.

Even an operational and properly insulated system poses a potential problem for service technicians in the case of a PV array in need of service. In the case of the need to replace a defective module the person may be exposed to high voltages even with the DC disconnect in the "off" or "open" position.

In the case of earthquakes, floods, or other natural disasters, partially destroyed PV systems pose a threat to the occupants of a structure and any rescue personnel, especially untrained civilians.

SUMMARY

Implementations of a solar photovoltaic module safety shutdown system may include: a module switch, the module switch configured to operatively couple with a first circuit having a photovoltaic module and to operatively couple with a System-Monitor device, the System-Monitor device configured to operatively couple to the module switch through a second circuit and configured to operatively couple to the photovoltaic module and an AC main panelboard through the first circuit; wherein the System-Monitor device is configured to generate a System-On signal and to feed the System-On signal to the module switch through the second circuit; and wherein the module switch is configured to disable the photovoltaic module through one of shorting the photovoltaic module and disconnecting the photovoltaic module from the first circuit in response to the System-On signal not being received by the module switch from the System-Monitor device.

Implementations of a solar photovoltaic module safety shutdown system may include one, all, or any of the following:

The module switch may include an opto-isolated FET photovoltaic driver configured to provide a gate voltage to a power MOSFET in response to the System-On signal being received by the module switch from the System-Monitor device.

The module switch may not include a rectifier, and the opto-isolated FET photovoltaic driver may be configured to provide the gate voltage only during half of an AC cycle.

A gate of the power MOSFET may be configured to store a sufficient charge to remain at a high enough voltage to allow the power MOSFET to remain on during an entire AC cycle.

The module switch may further include a resistor configured to drain a gate charge of the power MOSFET to bring the power MOSFET to an off state in response the System-On signal not being received by the module switch from the System-Monitor device.

The System-On signal may include one of alternating current and a light signal communicated through a fiber optic cable.

The System-Monitor device may include a manual switch and may be configured to generate the System-On signal and to feed the System-On signal to the module switch only when the manual switch is in an on position.

The module switch may include an opto-isolator configured to communicatively couple the first circuit with the second circuit while electrically isolating the first circuit from the second circuit.

Implementations of a solar photovoltaic module safety shutdown system may include: a photovoltaic module having a module switch operatively coupled thereto, the module switch and photovoltaic module configured to operatively couple with a first circuit, the module switch configured to operatively couple with a System-Monitor device, the System-Monitor device configured to operatively couple to the module switch through a second circuit and configured to operatively couple to the photovoltaic module and an AC main panelboard through the first circuit; wherein the System-Monitor device is configured to generate a System-On signal and to feed the System-On signal to the module switch through the second circuit; and wherein the module switch is configured to disable the photovoltaic module through one of shorting the photovoltaic module and disconnecting the photovoltaic module from the first circuit in response to the System-On signal not being received by the module switch from the System-Monitor device.

Implementations of a solar photovoltaic module safety shutdown system may include one, all, or any of the following:

The System-Monitor device may include a manual switch and may be configured to generate the System-On signal and to feed the System-On signal to the module switch only when the manual switch is in an on position.

A connector may be operatively coupled to the module switch and may be configured to operatively couple to a second connector coupled to a second module switch of a second photovoltaic module and to partially form the second circuit.

The module switch may include an opto-isolated FET photovoltaic driver configured to provide a gate voltage to a power MOSFET during half of an AC cycle in response to the System-On signal being received by the module switch from the System-Monitor device.

A gate of the power MOSFET may be configured to store a sufficient charge to remain at a high enough voltage to allow the power MOSFET to remain on during an entire AC cycle.

The module switch may further include a resistor configured to drain a gate charge of the power MOSFET to bring the power MOSFET to an off state in response the System-On signal not being received by the module switch from the System-Monitor device.

The module switch may be integrally formed within a back sheet of the photovoltaic module.

The module switch may include an opto-isolator configured to communicatively couple the first circuit with the second circuit while electrically isolating the first circuit from the second circuit.

Implementations of a solar photovoltaic module safety shutdown system may include: a module switch, the module switch configured to operatively couple with a first circuit having a photovoltaic module, the module switch configured to operatively couple with a System-Monitor device, the System-Monitor device configured to operatively couple to the module switch through a second circuit and configured to operatively couple to the photovoltaic module and an AC main panelboard through the first circuit; wherein the System-Monitor device is configured to generate a System-On signal and to feed the System-On signal to the module switch through the second circuit; wherein the module switch is configured to disable the photovoltaic module through one of shorting the photovoltaic module and disconnecting the photovoltaic module from the first circuit in response to the System-On signal not being received by the module switch from the System-Monitor device, and; wherein the module switch and System-Monitor at least partially form a system configured to deactivate a plurality of photovoltaic modules.

Implementations of a solar photovoltaic module safety shutdown system may include one, all, or any of the following:

The module switch may include an opto-isolated FET photovoltaic driver configured to provide a gate voltage to a power MOSFET during half of an AC cycle in response to the System-On signal being received by the module switch from the System-Monitor device.

A gate of the power MOSFET may be configured to store a sufficient charge to remain at a high enough voltage to allow the power MOSFET to remain on during an entire AC cycle, and the module switch may further include a resistor configured to drain a gate charge of the power MOSFET to bring the power MOSFET to an off state in response the System-On signal not being received by the module switch from the System-Monitor device.

The System-Monitor device may include a manual switch and may be configured to generate the System-On signal and to feed the System-On signal to the module switch only when the manual switch is in an on position.

The foregoing and other aspects, features, and advantages will be apparent to those artisans of ordinary skill in the art from the DESCRIPTION and DRAWINGS, and from the CLAIMS.

DESCRIPTION

Typically a firefighter disables power to a dwelling at the main AC panelboard of a home prior to dousing it with water. Shutting off power to the AC main panelboard automatically disables every individual module in a photovoltaic (PV) array in one embodiment. In natural disasters the AC mains of a building will likely be off, again making the PV system safe in one embodiment. Additional systems allow for automatic shutdown in the case of natural disasters.

Figure 3:
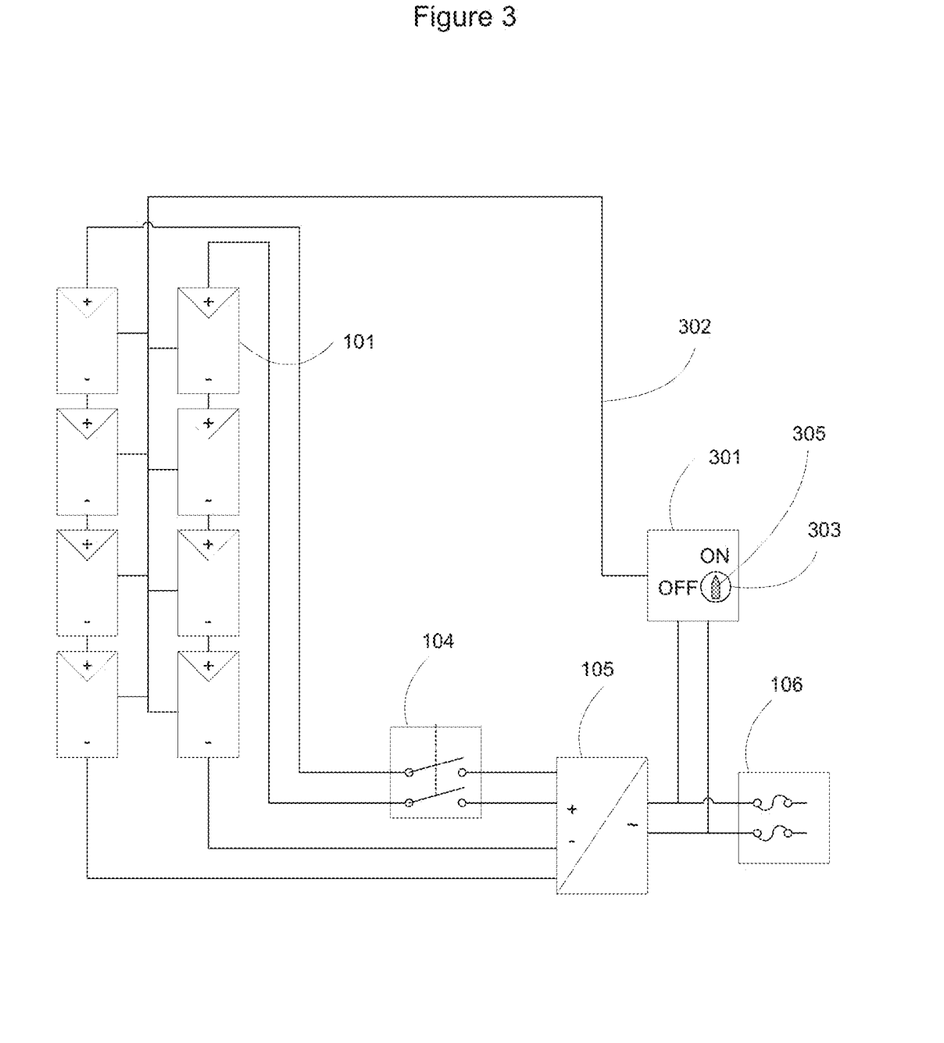
FIG. 3 illustrates an embodiment of a PV system with the additional system-level components.

A System-Monitor device 301 creates a "System-On" signal 302, which each individual solar module receives to activate itself and operate normally, as shown in FIG. 3. This signal controls (i.e. enables or disables) each module individually. Disabling a module can be achieved, for example, by shorting out the module or by opening up the string circuit that connects all the modules together. The System-Monitor device is connected to the AC power of the system, and when the AC power is off, the "System-On" signal is no longer "true."

Additionally, a manually operated switch 303 that is key operated may also be used to disable the PV system and each individual module therein, in some embodiments. The manual switch may be used by firefighters as well as service technicians to disable all the modules individually. It includes visual feedback 305 to indicate its state.

Figure 4:
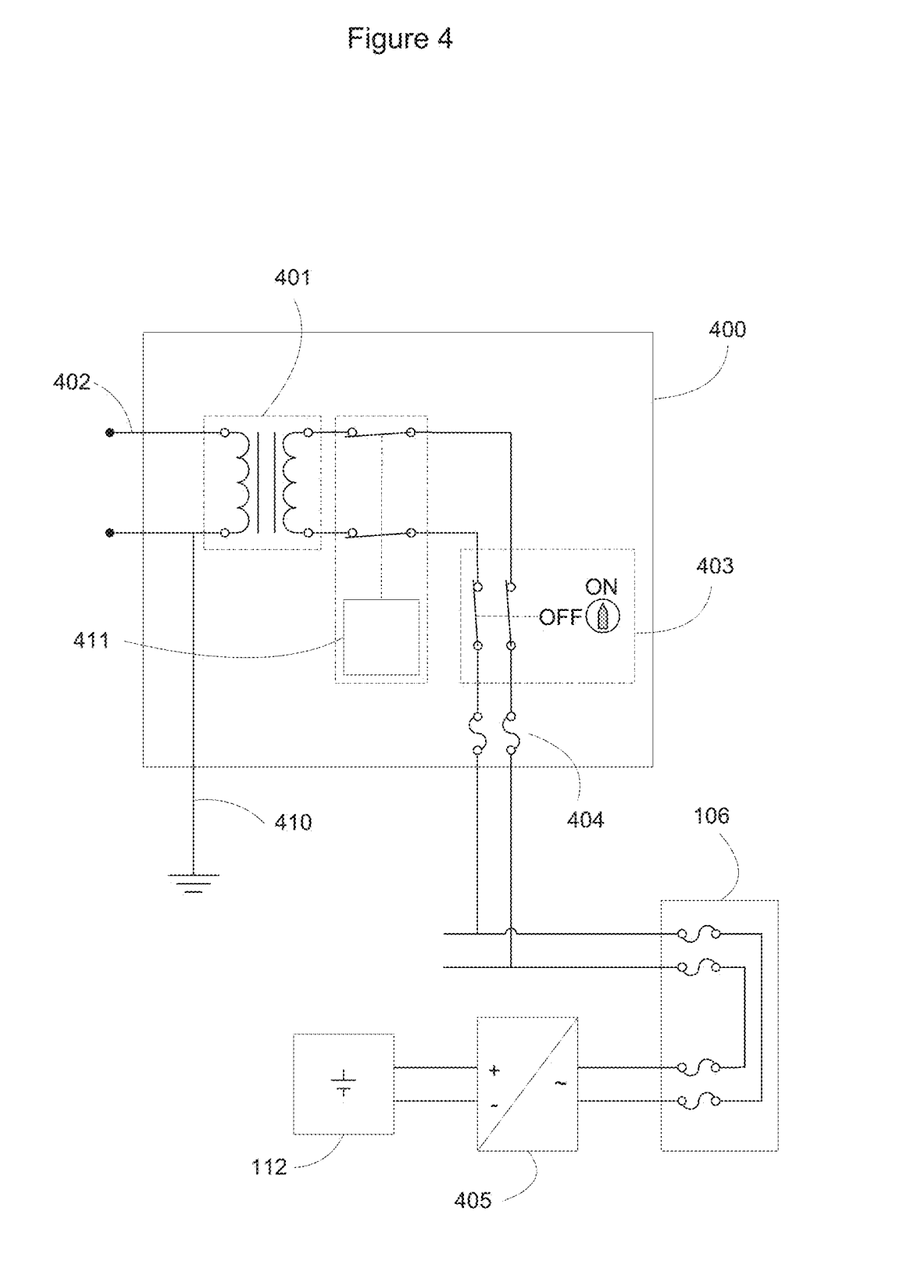
FIG. 4 illustrates the elements within the system-monitor function.

The System-Monitor 400, shown in FIG. 4, generates the System-On signal for the modules to begin operation. In one embodiment this particular component is a simple step down transformer 401. Typically, 240 V AC from the AC main panelboard is connected to the primary coil. The transformer generates a low voltage (e.g. ~12V AC 60 Hz) signal pair 402 on the secondary coil. An active (e.g. 12V AC) signal indicates to the modules that the AC grid is on, or "System-On" is true. The active signal may be fed via a set of wires that is then routed to each module, for example, by "daisy chaining" the System-On signal to every module. The System-Monitor device may have a manual switch 403 with a key-lockout that disconnects the step down transformer from the AC power operated by anyone who needs to disable the PV system.

The System-Monitor may employ internal protection fuses 404 for fault conditions. In the case of an off-grid system, the off-grid inverter 405 supplies AC power in order for the System-Monitor to operate. Depending on code or safety requirements, one leg of the System-On signal may be bonded to ground with a conductor 410.

For natural or man-made disasters, a motion, water or heat sensor and switch 411 may automatically disable the "System-On," for example, in case of earthquakes, floods, or fires. Those skilled in the art of electronic or electrical design recognize the many options to implement such a sensor switch.

Figure 5:
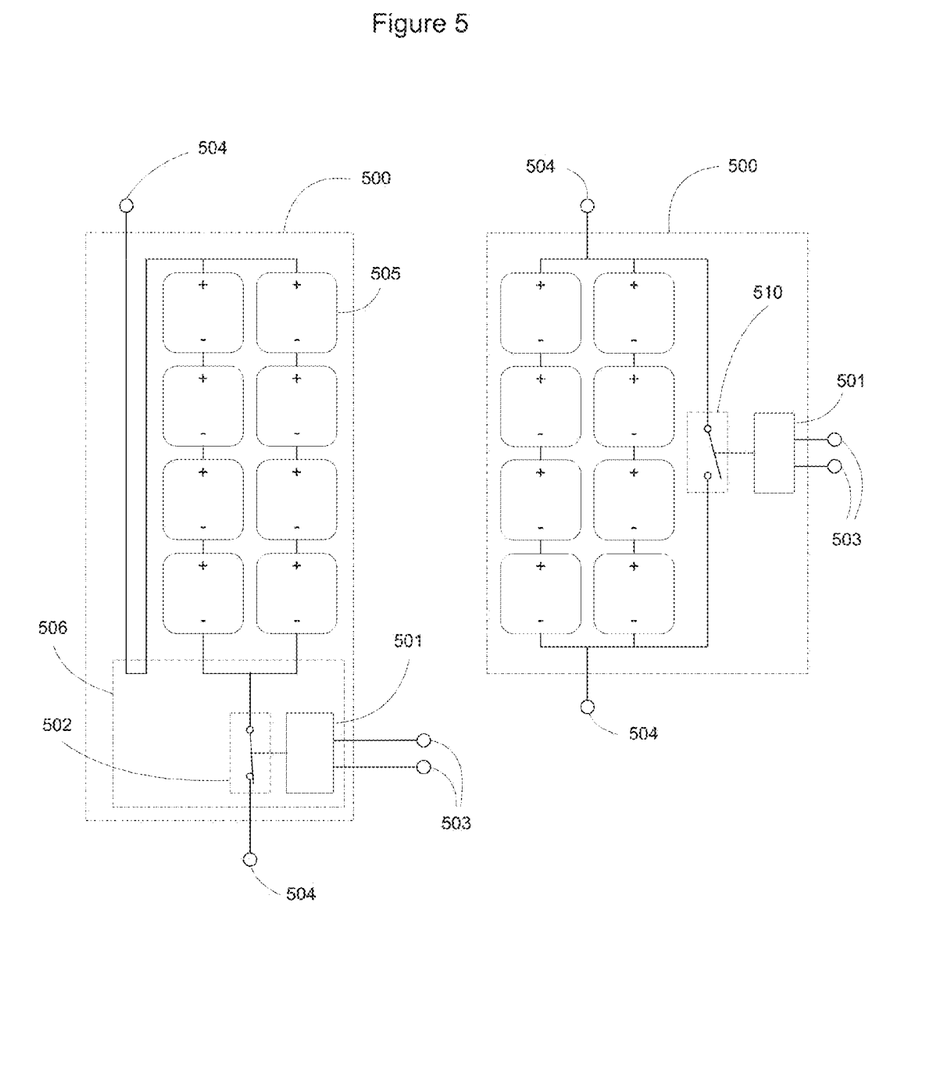
FIG. 5 illustrates the two possible methods to control an individual module.

FIG. 5 illustrates one embodiment of a mechanism to control the module's power production. Solar photovoltaic module junction box 506 may include a logic element 501 and module switch 502 may be part of the module assembly 500 (e.g. inside the module junction box) or be a separate element wired to the module (not shown). The System-On signal may be connected to the logic element with a twin lead connector 503. The module terminals 504 deliver direct current (DC) potential to other modules to form a string. The module switch 502 can be in series with the PV cells 505 and one of the module terminals, in this case the switch 502, disconnects the PV cells from the array. In a second embodiment, the module switch 510 can be parallel to the PV cells, connecting to both module terminals. The junction box 506 may be a physical box that is secured to or integrated with a photovoltaic module. It may be attached by the module manufacturer at the time of manufacture or thereafter by third parties, in some embodiments.

Each of the module switches is electrically isolated from other module switches since each operates at a different voltage potential. This is due to the series wiring of the modules into a string and the fact that all the module switches share a common signal "System-On". A given module switch in a given array may be operating at a high potential (e.g. 400V) to ground, and the next module in the string at 350V, and so on, assuming each module generated 50 Volts (DC). Electrical isolation between the common System-On signal and the module switch can be achieved a number of ways including but not limited to AC transformer coupling, or optical coupling inside the logic element 501.

The logic element and switch circuitry can be designed in a number of ways. Those skilled in the art of electronic circuit design will understand the proper selection of the individual components, the detail of which is left out for clarity.

The electro-magnetic relay-based system uses electromechanical systems for isolation and switching. The signal System-On has enough power to energize a standard AC relay coil. The signal is operating at a voltage considered safe to humans (low voltage, e.g. 12V AC). To control a module using a relay, the switch may be in series or in parallel with the PV cells.

Figure 6:
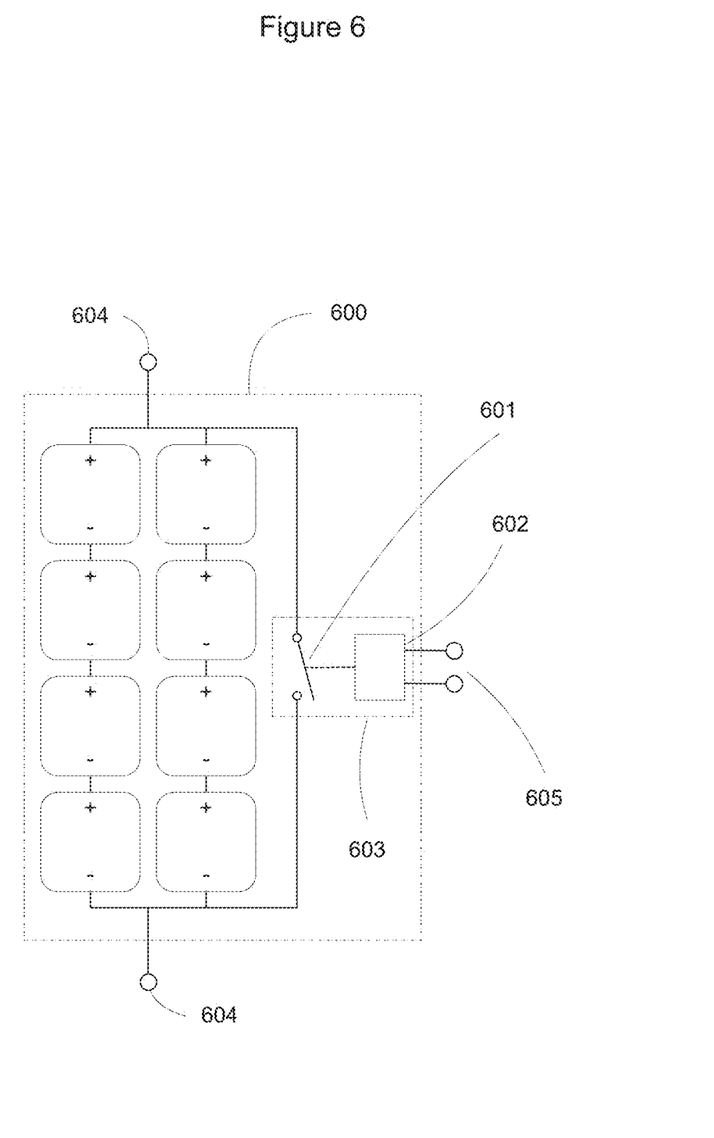
FIG. 6 illustrates a module embodiment utilizing an electromechanical relay as the means to control the module.

FIG. 6 shows the circuit of a module assembly 600 with the module switch in parallel. In a system where the signal System-On is true (e.g. 12V AC) the energized coil 602 moves the normally closed (NC) contact 601 of the relay 603 to open up and allows the cells to produce power at the module terminals. The power from the System-On signal connects to the relay's coil through the two-contact System-On connector 605, and the isolation between the System-On signal and the module switch is provided inherently between the relay coil and the relay's contact.

Figure 7:
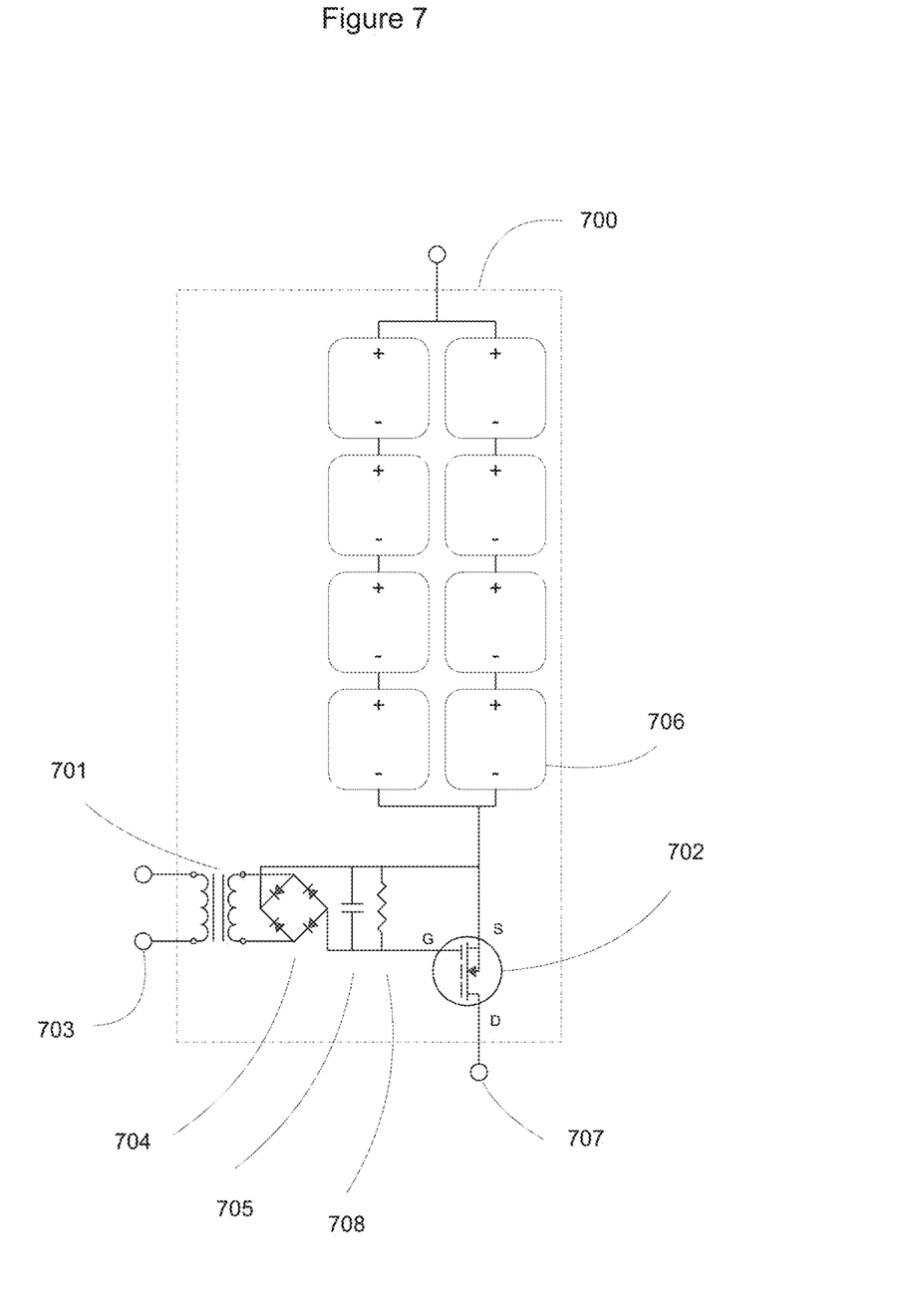
FIG. 7 illustrates a module embodiment utilizing a transformer and transistor as the means to control the module.

FIG. 7 shows the circuit of a module assembly 700 utilizing a small transformer 701 along with a few other components and a transistor 702 to perform the logic element and module switch functions. A basic transformer AC couples the System-On signal, present at the connector 703, through a primary coil to a secondary coil. The primary and secondary coils provide the needed isolation. The coupled and isolated System-On signal is now converted to a DC control signal, for example, through a 4-diode rectifier 704, and the rectified AC ripples are reduced with a capacitor 705. This circuit provides a positive voltage of sufficient level to turn on a power MOSFET transistor 702. The MOSFET source terminal is connected to the negative terminal of the first in a series of cells 706, and the MOSFET drain terminal is connected to the module negative terminal wire 707.

When the System-On signal is false (0V AC), the transistor is off due to the gate voltage (Vgs) being zero, and the module is disconnected from the other modules in the array. With the signal present the transistor will be on and it will close the circuit with the other modules in the string. To ensure the transistor turns off without a system-On signal, a resistor 708 discharges the capacitor.

Figure 8:
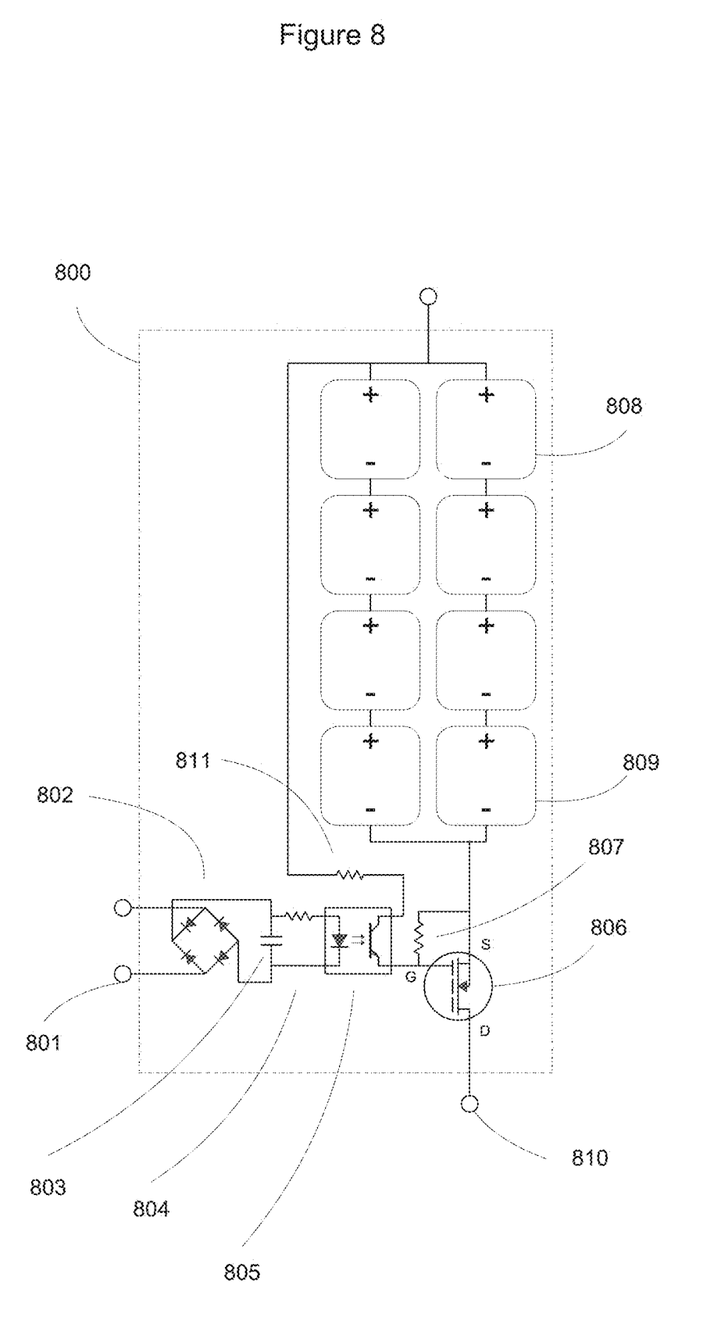
FIG. 8 illustrates a module embodiment utilizing an opto-isolator and transistor as the means to control the module.

The transformer in the previous example can be replaced with an opto-isolator component, as shown in FIG. 8. The System-On signal at the System-On connector 801 is converted to a DC voltage with a diode rectifier 802 and capacitor 803. The DC voltage is current limited through a series resistor 804 to operate the opto-isolator's 805 transmitter (LED). The light energy will activate a photosensitive photo detector (e.g. transistor) in the opto-isolator, the light is providing the electrical isolation. When light is present the opto-isolator's transistor is conducting current, otherwise not. The opto-isolator transistor controls a MOSFET transistor 806, able to handle the module power loads. The N-channel MOSFET is by default off (or open) since the gate is pulled down to the same level as the source with a resistor 807. When the opto-isolator's transistor is on it will raise the voltage of the MOSFET's gate close to the level present at the positive terminal of the last cell in the module 808 if light is present. The MOSFET will be in fully saturated mode and "on," connecting the negative terminal of the first cell 809 to the module's negative terminal 810 allowing the module current to flow through the array. The voltage feeding the gate may need to be limited to protect the MOSFET depending on the choice of components; this can be achieved with an additional resistor 811.

Figure 9:
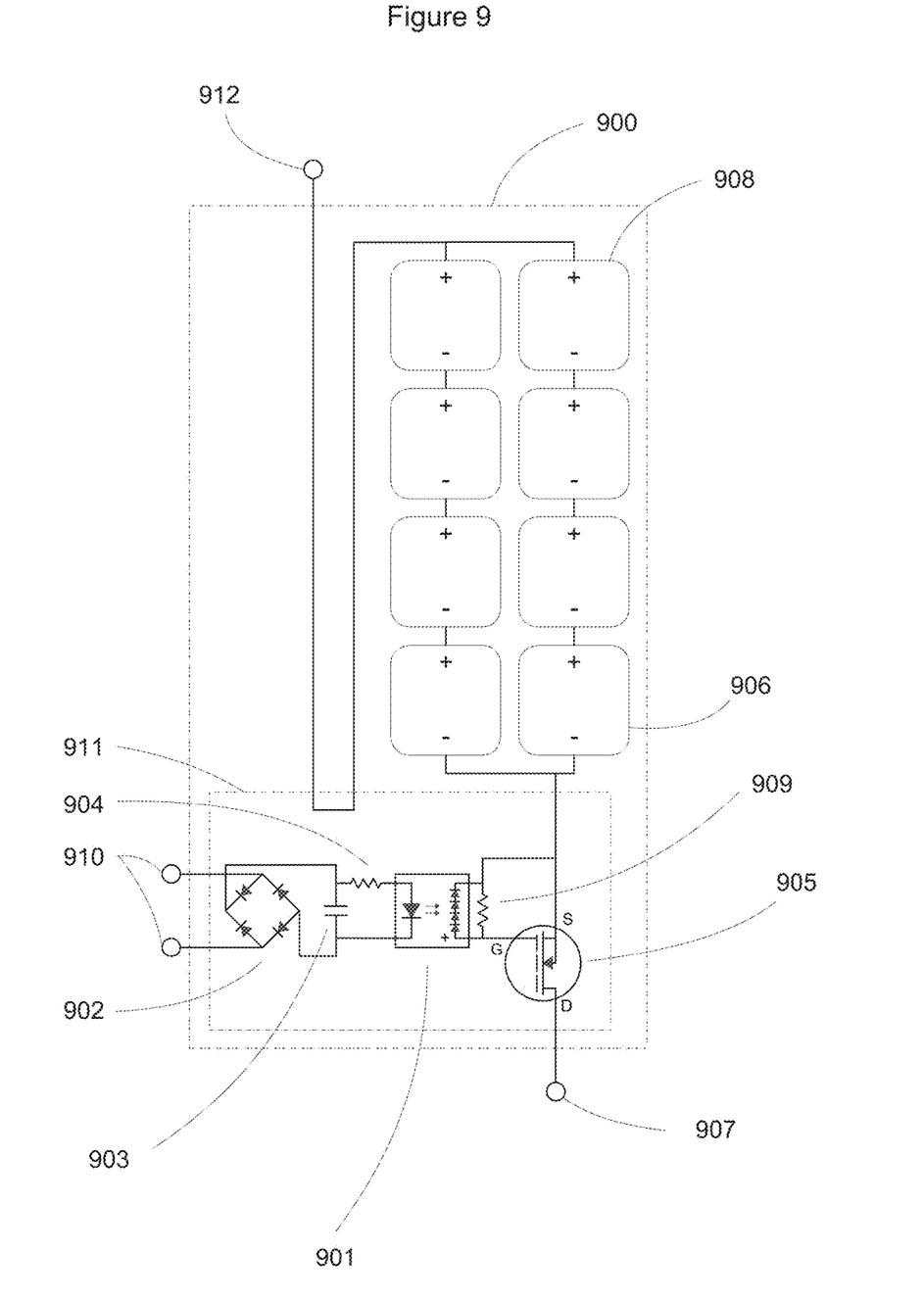
FIGS. 9 and 10 illustrate a module embodiment utilizing an FET driver and transistor as the means to control the module.

FIG. 9, solar module 900 junction box 911 utilizes a photovoltaic MOSFET (PV FET) driver 901 as the isolation function. The System-On signal is converted to DC through the rectifier 902, capacitor 903, and is current limited through a resistor 904 as it drives the light transmitter (LED) of the PV FET driver. The light energy will be converted by the PV FET driver's photodiodes to a DC voltage of sufficient voltage to directly drive the MOSFET transistor 905 to a fully saturated mode. This in turn will connect the negative terminal of the first cell 906 to the negative module terminal 907. A resistor 909 will guarantee that the transistor will be off by default, by discharging any energy stored from leakage or stray capacitance. The positive module terminal 912 is coupled to cells 908. System-On connector 910 may use twin leads.

Figure 10:
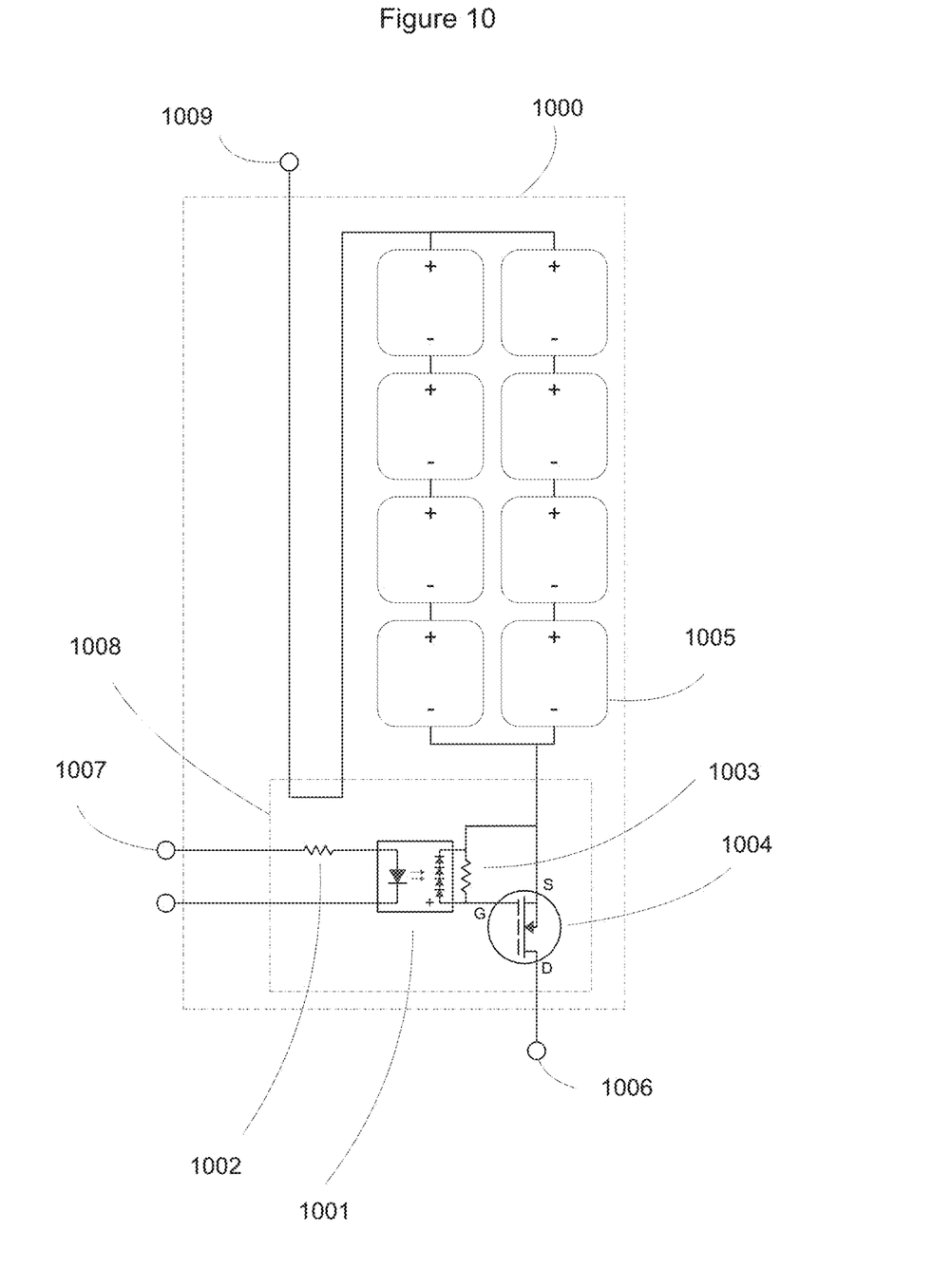

FIG. 10 illustrates another design, which has very few components for reliability and low cost. The System-On signal current (via connector 1007) is limited through resistor 1002 and drives the photo-diode of the FET photovoltaic driver 1001 in the solar module 1000 junction box 1008 to generate light energy for half of the AC cycle. The light energy is converted by the FET-driver to a DC voltage, which is applied to the MOSFET transistor 1004. The inherent gate capacitance of the MOSFET is sufficient to store the needed voltage to turn on the FET for the entire AC cycle, thus eliminating any gate charge storage device. A resistor 1003 turns off the FET to bring it to desired default state of "off" by draining the FET gate charge when the System-On signal is not present. When the System-On signal is present, the transistor is on or fully saturated. This in turn connects the negative terminal of the first cell 1005 to the negative module terminal 1006.

Figure 11:
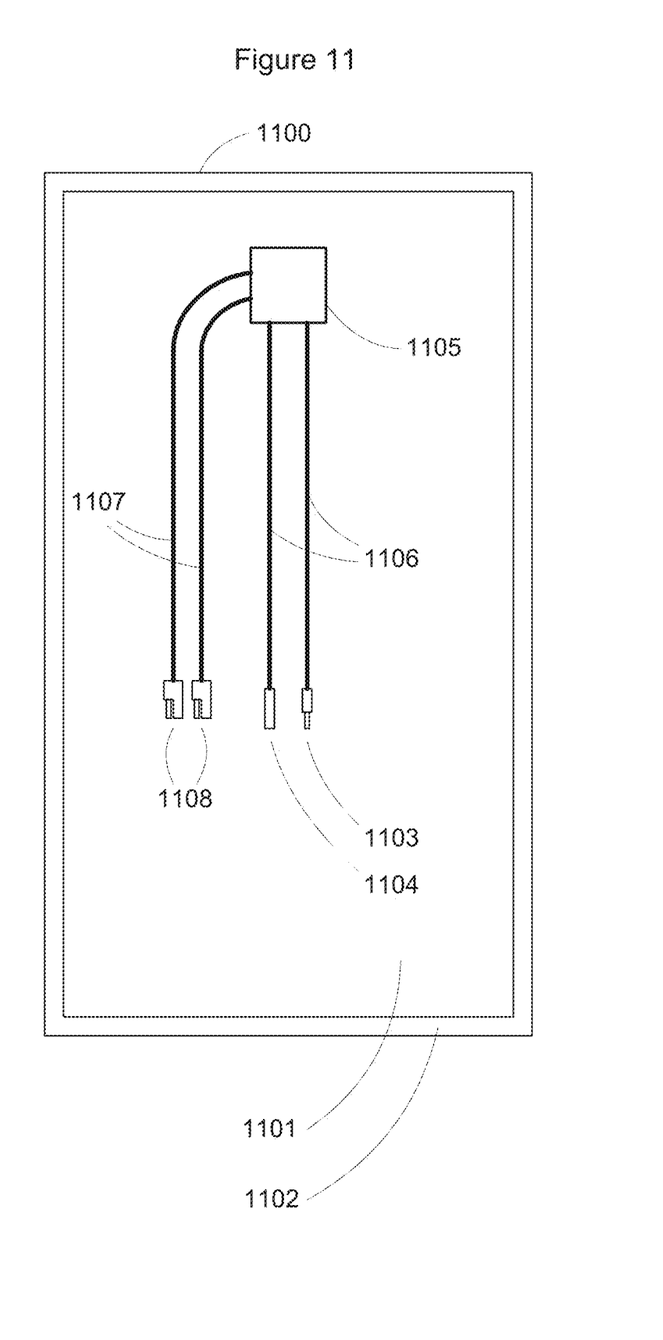
FIG. 11 is a depiction of the back side of one embodiment of a solar module.

Finally, referring to FIG. 11, the back side of a solar module, such as the solar module 1100, is depicted. The back side is the side which is not exposed to receive solar energy. The back side of the module 1100 may include a back sheet 1101. In one embodiment, the junction box 1105 may be integrally formed within the back sheet 1101. In other embodiments, it may be a physical box, such as a plastic electrical box, accessible through the back sheet 1101. A pair of leads 1106 may be provided with a positive terminal 1103 and a negative terminal 1104 to connect a DC potential to the neighboring modules into a string. A second pair of leads 1107 may be provided to "daisy chain" the System-On signal from one module to the next. The connectors 1108 for the System-On signal contain two contacts each.

Another approach is to deliver the signal representing "System-On" as a light signal to the modules. This example requires a modification to the System-Monitor device, which will be sending light instead of an AC signal. Each module receives a fiber optic cable and the light received is converted to a voltage as in the case of the MOSFET driver through a series of photo diodes to a voltage level sufficient to turn on the FET.

Those skilled in the art of electronics can appreciate the possible variations of connecting a common signal (System-On) with some form of energy such as an AC or DC voltage, radio waves, or light to an isolated logic element. The logic element in turn drives a module switch that enables power output from the module. The Switch itself may also be integrated into one of the cells in the series (gated cell). Furthermore the circuit that controls the PV module may be part of the module or a separate system component that the module will plug into. The previous examples illustrate a few of the possible ways to implement the principle idea.

In systems with a number of distributed inverters, one for each module, there is no equivalent of the DC disconnect switch, and by turning off the AC mains the PV system will shut down if the micro-inverters are operating as expected. However the ability to shut the PV system down by disabling the power generated from the module itself via the System-Monitor device (using the manual lockout switch) provides an additional safety measure and more importantly a consistent and clear visual means to firefighters to ensure that the PV array is indeed off. It also provides a safe and lockable means to people servicing the modules.

Currently a module is "live" the moment it leaves the module factory; there is no "off" switch. Like a charged car battery, PV modules are dangerous to the untrained, and able to generate power. Once an array is wired into a PV system it is a permanent installation and is not ever typically disconnected. The array wires pose a particularly lethal level of power to people since the voltages are typically 200-600V, which by NFPA NEC (National Electric Code) definition is well above "low voltage systems." The only practical means of switching off an array is at the singular DC disconnect point where the lethal voltage levels are present even when switched off. Firefighters are trained to shut off the DC disconnect and the AC mains to a building, however even after both of these actions occur the power generated by the array continues to be present in the array, within the modules, and the wiring on the roof or inside the home leading up to the DC disconnect. If a firefighter were to use an axe to ventilate a roof, cut a wire, cut into a module, or douse a broken array with water—the firefighter would be exposed to high voltages. A path of lethal current to (earth) ground will exist. Additionally if a PV service technician were diagnosing a faulty array for ground faults, or replacing a broken module, this person will be exposed to very high voltages, requiring very careful conduct without any mistakes to remain safe. Electricians prefer in all cases to "lock out and tag out" any circuit they are working on, however a PV array cannot be shut down by any practical means.

By installing a switch in each module it is possible to deactivate each individual module to a level where the voltages will be in the order of 18-50 volts or less. At these levels it is safe to handle the modules or any components of the array.

Each module receives a "System-On" signal, a corresponding logic element, and a switch in or near the module will perform the control of each individual module. These may take the form of simple coils and relays or in other embodiments optical and electronic components. The reliability or cost of these simple components does not pose a cost burden nor a reliability challenge for module manufacturing. Each module has a junction box with a few electronic components in it today (diodes), and this shutdown system can add a few more to the module. In addition to the module switch the PV system may use a System-Monitor device. This function may be built into the grid-tie inverter or the off-grid battery charger to lower overall parts and costs.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A solar photovoltaic module safety shutdown system, comprising:
   a module switch, the module switch configured to operatively couple with a first circuit comprising a photovoltaic module and to operatively couple with a System-Monitor device, the System-Monitor device configured to operatively couple to the module switch through a second circuit and configured to operatively couple to the photovoltaic module and an AC main panelboard through the first circuit;
   wherein the System-Monitor device is configured to generate a System-On signal and to feed the System-On signal to the module switch through the second circuit; and
   wherein the module switch is configured to disable the photovoltaic module through one of shorting the photovoltaic module and disconnecting the photovoltaic module from the first circuit in response to the System-On signal not being received by the module switch from the System-Monitor device.

2. The system of claim 1, wherein the module switch comprises an opto-isolated FET photovoltaic driver configured to provide a gate voltage to a power MOSFET in response to the System-On signal being received by the module switch from the System-Monitor device.

3. The system of claim 2, wherein the module switch does not comprise a rectifier, and wherein the opto-isolated FET photovoltaic driver is configured to provide the gate voltage only during half of an AC cycle.

4. The system of claim 3, wherein a gate of the power MOSFET is configured to store a sufficient charge to remain at a high enough voltage to allow the power MOSFET to remain on during an entire AC cycle.

5. The system of claim 2, wherein the module switch further comprises a resistor configured to drain a gate charge of the power MOSFET to bring the power MOSFET to an off state in response the System-On signal not being received by the module switch from the System-Monitor device.

6. The system of claim 1, wherein the System-On signal comprises one of alternating current and a light signal communicated through a fiber optic cable.

7. The system of claim 1, wherein the System-Monitor device comprises a manual switch and is configured to generate the System-On signal and to feed the System-On signal to the module switch only when the manual switch is in an on position.

8. The system of claim 1, wherein the module switch comprises an opto-isolator configured to communicatively couple the first circuit with the second circuit while electrically isolating the first circuit from the second circuit.

9. A solar photovoltaic module safety shutdown system, comprising:
   a photovoltaic module comprising a module switch operatively coupled thereto, the module switch and photovoltaic module configured to operatively couple with a first circuit, the module switch configured to operatively couple with a System-Monitor device, the System-Monitor device configured to operatively couple to the module switch through a second circuit and configured to operatively couple to the photovoltaic module and an AC main panelboard through the first circuit;
   wherein the System-Monitor device is configured to generate a System-On signal and to feed the System-On signal to the module switch through the second circuit; and
   wherein the module switch is configured to disable the photovoltaic module through one of shorting the photovoltaic module and disconnecting the photovoltaic module from the first circuit in response to the System-On signal not being received by the module switch from the System-Monitor device.

10. The system of claim 9, wherein the System-Monitor device comprises a manual switch and is configured to generate the System-On signal and to feed the System-On signal to the module switch only when the manual switch is in an on position.

11. The system of claim 9, further comprising a connector operatively coupled to the module switch and configured to operatively couple to a second connector coupled to a second module switch of a second photovoltaic module and to partially form the second circuit.

12. The system of claim 9, wherein the module switch comprises an opto-isolated FET photovoltaic driver configured to provide a gate voltage to a power MOSFET during half of an AC cycle in response to the System-On signal being received by the module switch from the System-Monitor device.

13. The system of claim 12, wherein a gate of the power MOSFET is configured to store a sufficient charge to remain at a high enough voltage to allow the power MOSFET to remain on during an entire AC cycle.

14. The system of claim 13, wherein the module switch further comprises a resistor configured to drain a gate charge of the power MOSFET to bring the power MOSFET to an off state in response the System-On signal not being received by the module switch from the System-Monitor device.

15. The system of claim 9, wherein the module switch is integrally formed within a back sheet of the photovoltaic module.

16. The system of claim 9, wherein the module switch comprises an opto-isolator configured to communicatively couple the first circuit with the second circuit while electrically isolating the first circuit from the second circuit.

17. A solar photovoltaic module safety shutdown system, comprising:
   a module switch, the module switch configured to operatively couple with a first circuit comprising a photovoltaic module, the module switch configured to operatively couple with a System-Monitor device, the System-Monitor device configured to operatively couple to the module switch through a second circuit and configured to operatively couple to the photovoltaic module and an AC main panelboard through the first circuit;
   wherein the System-Monitor device is configured to generate a System-On signal and to feed the System-On signal to the module switch through the second circuit;
   wherein the module switch is configured to disable the photovoltaic module through one of shorting the photovoltaic module and disconnecting the photovoltaic module from the first circuit in response to the System-On signal not being received by the module switch from the System-Monitor device, and;
   wherein the module switch and System-Monitor at least partially form a system configured to deactivate a plurality of photovoltaic modules.

18. The system of claim 17, wherein the module switch comprises an opto-isolated FET photovoltaic driver configured to provide a gate voltage to a power MOSFET during half of an AC cycle in response to the System-On signal being received by the module switch from the System-Monitor device.

19. The system of claim 18, wherein a gate of the power MOSFET is configured to store a sufficient charge to remain at a high enough voltage to allow the power MOSFET to remain on during an entire AC cycle, and wherein the module switch further comprises a resistor configured to drain a gate charge of the power MOSFET to bring the power MOSFET to an off state in response the System-On signal not being received by the module switch from the System-Monitor device.

20. The system of claim 17, wherein the System-Monitor device comprises a manual switch and is configured to generate the System-On signal and to feed the System-On signal to the module switch only when the manual switch is in an on position.

* * * * *